United States Patent [19]
Wakefield

[11] Patent Number: 5,598,034
[45] Date of Patent: Jan. 28, 1997

[54] PLASTIC PACKAGING OF MICROELECTRONIC CIRCUIT DEVICES

[75] Inventor: Gene F. Wakefield, Plano, Tex.

[73] Assignee: VLSI Packaging Corporation, Richardson, Tex.

[21] Appl. No.: 922,041

[22] Filed: Jul. 22, 1992

[51] Int. Cl.$^6$ .......................... H01L 23/10; H01L 23/34
[52] U.S. Cl. .......................... 257/706; 257/707
[58] Field of Search .................. 307/70, 74, 80, 307/72, 73; 257/628, 680, 681, 704, 706, 710, 711, 712, 713, 720, 722, 707

[56] References Cited

U.S. PATENT DOCUMENTS

| | | | |
|---|---|---|---|
| 4,663,833 | 5/1987 | Tanaka et al. | 357/72 |
| 4,672,418 | 6/1987 | Moran et al. | 257/671 |
| 4,672,421 | 6/1987 | Lin | 257/777 |
| 4,723,156 | 2/1988 | Okuaki | 357/72 |
| 4,727,221 | 2/1988 | Saitau et al. | 357/72 |
| 4,784,974 | 11/1988 | Butt | 357/73 |
| 4,926,242 | 5/1990 | Itoh | 257/720 |
| 4,994,897 | 2/1991 | Golubic et al. | 257/667 |
| 5,105,259 | 4/1992 | McShane et al. | 357/70 |

*Primary Examiner*—Mahshid D. Saadat
*Assistant Examiner*—S. V. Clark
*Attorney, Agent, or Firm*—Jack A. Kanz

[57] ABSTRACT

Thermally conductive heat transfer bodies are included in plastic packages to extend from the die pad and/or circuit chip to or near the surface of the package. Leakage is prevented by encapsulating the heat transfer body in a thin film of plastic and/or by arranging the interface between metal and plastic to be elongated and convoluted. The heat transfer body is attached to the die pad and/or lead frame to stabilize the body during molding and to aid in thermal communication between the chip and the heat transfer body. Air cavities and EMI shielding are provided by caps secured to the lead frames.

33 Claims, 2 Drawing Sheets

PLASTIC PACKAGING OF MICROELECTRONIC CIRCUIT DEVICES

This invention relates to packaging of electronic circuit device components. More particularly, it relates to packaging arrangements which include a cavity surrounding the circuit components to permit use of plastic packaging for high frequency devices and to arrangements which provide rapid conduction of thermal energy from the circuit component to the package exterior. The novel arrangements are formed employing relatively inexpensive and versatile plastic packaging techniques. This invention also relates to packaging arrangements which control electromagnetic radiation into or out of the package.

Advances in microelectronics technology tend to develop device chips which occupy less physical space while performing more functions. Conventionally, the chips are packaged for use in housings which protect the chip from its environment and provide means for input/output communications between the chip and external circuitry. The continuing drive toward miniaturization thus results in generation of more heat in less physical space with less structure for removing heat from the package. Similarly, the development of electronic circuit device chips using compound semiconductors further expands the requirements for packaging which can contain devices operating at higher temperatures and control device temperatures by heat dissipation.

Miniaturization of chips has also led to encapsulation of more than one chip body within a single package housing. The chips may be supported on one or both sides of a substrate or rerouting board and may even be assembled in stacked arrangements. For purposes of this disclosure, the terms "chip", "die" and "circuit device" and the like are used interchangeably and are intended to cover all electronic circuit device configurations enclosed within a single housing or package, regardless of whether such device configuration is in the form of one or more pieces of semiconductor material and/or supporting interconnection structure.

Conventionally, high pin-count packages are generally either ceramic packages or plastic packages. Ceramic packages are better heat conductors than plastics, provide hermetic sealing and are thus generally considered more reliable. However, ceramic packaging is relatively expensive. Transfer and injection molded plastic packaging is much less expensive and is therefore widely used when the advantages of hermetic sealing are not essential.

Ceramic and glass packages can be arranged to provide a gas-filled or evacuated cavities surrounding the circuit chip because hermetic sealing of the cavity can be achieved. In plastic packages, the chip and electrical interconnections between the chip and the lead frame are all encapsulated in the plastic material. The encapsulating plastic material has a higher dielectric coefficient than air which results in reduced frequency transmission signals through the interconnections encapsulated in plastic.

Electronic devices generate heat in operation and, in most cases, the devices are temperature sensitive. The temperature at which the device chip operates and the ability to remove heat from the chip may, in fact, determine or limit various operating characteristics of the circuit. Thus means is often provided for conducting heat from the package to an external sink. In simple plastic-encapsulated devices, the heat may be adequately removed by the leads. The encapsulating plastic, however, is not a particularly effective heat transfer medium. Accordingly, as the density of device functions increases, the need for effective heat dissipation increases. Where the device chip is encapsulated in the plastic, removal of thermal energy is difficult.

U.S. Pat. No. 3,930,114 to Hodge discloses a plastic package including a thermally conductive body which extends from the lead frame die pad supporting the chip to the external surface of the package. However, in order to stabilize the thermally conductive body during the encapsulation process, Hodge requires stabilizing legs which extend to the opposite surface of the plastic body. This package design, because of the many plastic-to-metal interfaces extending directly from the external package surface to the chip cavity, fails to provide adequate protection against invasion by water vapor and the like.

U.S. Pat. No. 5,057,903 to Olla discloses a plastic package structure in which a body of plastic containing particles of thermally conductive material is used to conduct heat from the chip directly to the package surface. However, the thermal conductivity of such metal-impregnated plastic cannot approach the thermal conductivity of metals and ceramics and, accordingly, this package concept fails to provide adequate means for rapidly conducting heat to the package surface.

In accordance with the present invention plastic packaging for electronic device chips is provided in which a gas-filled cavity is formed around the chip. To assure rapid conduction of heat from the chip the package may also include a thermally conductive body of metal, ceramic or the like which acts as a heat transfer body extending directly from the chip or the lead frame die pad to or near the surface of the plastic package. Heat may thus be conducted by the thermally conductive body directly from the chip to the package surface for extraction and dissipation. However, a substantially vapor-proof barrier must be formed between the plastic body and the heat transfer body. Plastics bond fairly well to ceramics. However, to provide an adequate seal between metal heat transfer bodies and the plastic body, the interface or junction between the metal heat transfer body and the plastic encapsulation material is adapted to provide an elongated path between the exterior of the package and the internal cavity containing the chip. The elongated junction thus provides a barrier to water vapor encroachment into the package and, because the metal-to-plastic junctions between the metal body and the plastic body do not form straight lines, the possibility of vapor leakage resulting from mismatch of coefficient of thermal expansion is minimized. Furthermore, by forming an irregular interface between the heat transfer body and the plastic body, mechanical integrity is assured and the package is much more resistant to mechanical stress. The packages of the invention thus permit use of inexpensive plastic packaging techniques to produce packages having direct conduction of heat from the interior of the package to the package surface without increased risk of water vapor leakage and without loss of mechanical package stability.

In accordance with a preferred embodiment of the invention the electronic device chip is encapsulated and contained within a gas-filled cavity or chamber within a plastic package. The invention further includes methods and apparatus for providing an electromagnetic radiation shield surrounding the electronic device chip. The invention thus permits use of relatively inexpensive plastic packaging techniques to package high frequency electronic circuit devices and devices which generate excessive amounts of heat. Other features and advantages of the invention will become more readily understood from the following detailed description taken in connection with the appended claims and attached drawing in which:

The general principles of post-molded plastic packaging are well known. Ordinarily, a metal lead frame is employed which includes a die pad and frame leads arranged in a pre-selected arrangement. The device chip is attached to the die pad and wire bonding or the like used to interconnect bonding pads on the device chip to the frame leads. The assemblies are then encapsulated in a thermoset molding compound using a transfer or injection molding process. The general process, which is well known, may be used to produce various configurations of device packages, all of which are within the scope of this invention.

Lead frames for plastic packages employ various configurations, all of which generally include a plurality of terminal leads which define a die location and extend outwardly therefrom. When the plastic package is formed on the lead frame, the die location and inner ends of the terminal leads are encapsulated in a plastic body defined by opposed major faces and opposed edges with terminal leads extending from at least one of the edges. The leads extending from the edge may be formed into any of various configurations for mounting and interconnection purposes.

Figure 3:
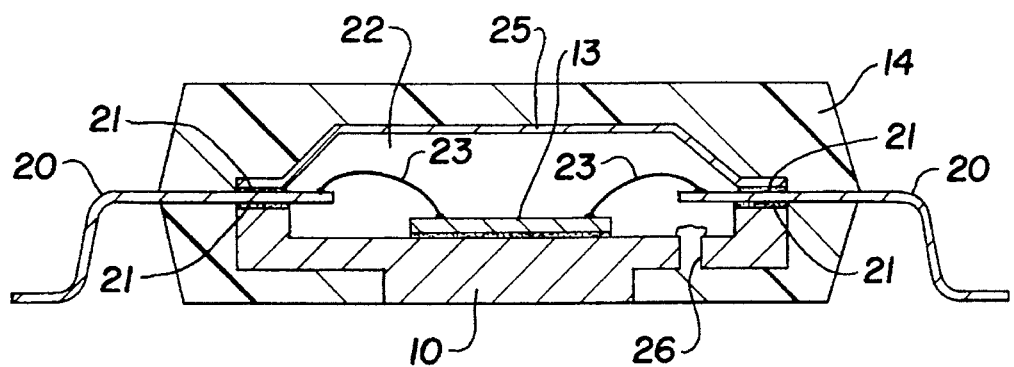
FIG. 3 is a sectional view of a plastic package in accordance with the invention which provides an air cavity and an electromagnetic radiation shield.

For purposes of simplicity and clarity of illustration, the invention is described herein with reference to the package configuration generally described as a quad flatpack which has gullwing leads as shown in FIG. 3 extending from all four lateral edges thereof and which is adapted to be surface mounted. The external terminal lead configuration, however, is not significant to the invention other than to limit the surface area and location on the package which may be used for attaching sinks for heat extraction. The packages illustrated herein are configured so that the heat conductive body presents a flat surface parallel or even coplanar with one surface of the quad flatpack plastic package. It will be readily recognized, however, that the principles of the invention may also be applied to produce packages of other designs and packages wherein the outer surface of the heat conductive body is not coplanar with the surface of the plastic body since it is only necessary that the exterior surface of the heat conductive body be in a position to be placed in thermal communication with an external heat sink or the like.

Except for the configuration of the package itself, this invention is not limited to any particular materials used for plastic packaging. It will be readily recognized that to fully exploit the advantages of the invention, thermosetting materials used for plastic packages should be selected which minimize mismatch of coefficient of thermal expansion between the plastic package and the device chip and/or the lead frame yet provide the desired physical and electrical characteristics.

Figure 1:
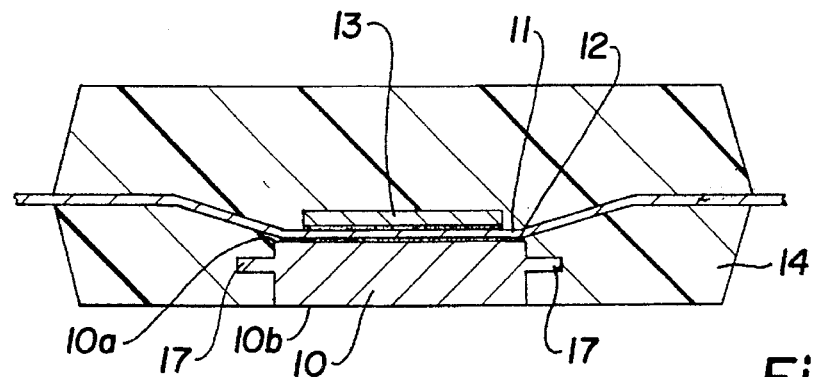
FIG. 1 is a sectional view of a plastic package illustrating one embodiment of the invention.

In the embodiment illustrated in FIG. 1, a generally orthogonal body 10 of thermally conductive material such as copper or the like is secured to the underside of the die pad paddle 11 of a conventional lead frame using an adhesive 12 or the like. Body 10 may, of course, be circular in plan dimensions or may be in any other geometric form desired or compatible with the package design. Adhesive 12 may be any suitably thermally conductive adhesive material. Where electrical isolation between die pad 11 and metal body 10 is required, the adhesive 12 should be a suitably electrically non-conductive adhesive. Alternatively, where electrical continuity between the die pad 11 and body 10 is acceptable or required, an electrically conductive adhesive may be used or the metal body 10 may be brazed or otherwise secured to the die pad 11. Obviously, various other means of securing the metal body 10 to the die pad 11 may be used as necessary to satisfy the electrical requirements of the package.

In order to ensure that the outer surface of the metal body 10 is properly oriented after completion of the molding procedure, the metal body 10 should be securely affixed to the die pad. As shown in FIG. 1, the metal body 10 has first and second oppositely disposed major faces 10a, 10b. Exterior face 10b is positioned to be coplanar with and thus form a portion of the external surface of the package. When the lead frame is positioned in the mold, the exterior face 10b rests directly on the surface of the mold. Therefore, to avoid overcoating the outer surface 10b of the metal body 10 with plastic material, the metal body 10 must be securely positioned and maintained adjacent the floor of the mold during molding.

As illustrated in FIG. 1, an electronic device chip 13 is secured to the opposite surface of die pad 11. Conventional interconnections such as wire leads from the chip 13 to the package input/output terminal leads are not shown because of the planes of the sectional views of FIGS. 1 and 2.

It will be observed that since the metal body 10 is connected directly to the die pad 11 and extends to the external surface of the package, heat can be conducted through the metal body 10 directly from the chip 13 to surface 10b and rapidly dissipated by connecting an external heat sink or the like in thermal communication with surface 10b. However, since the metal body 10 extends to the surface of the plastic package, a metal-to-plastic junction 15 is formed between the metal body 10 and the plastic body 14. The junction 15 extends from the exterior of the package into the cavity in which chip 13 is mounted. Because of differences in coefficient of thermal expansion as well as other dissimilar characteristics of metal and plastic, a hermetic seal cannot be readily formed between the metal body 10 and the plastic body 14. Accordingly, if the edge surfaces of the metal body 10 are smooth flat surfaces, the junction 15 provides a direct leakage path from the exterior of the package into the internal cavity, permitting leakage of water vapor and the like into the cavity. To minimize such leakage, the edge surfaces of the body 10 are not perpendicular to faces 10a and 10b. Instead, the edge surfaces are irregular and preferably include at least one outwardly extending flange 17 which increases the length of the metal-to-plastic junction 15 to at least twice the distance separating faces 10a and 10b. Two or more flanges could, of course, be used.

It will be observed that when the plastic package 14 is formed around the metal body 10, the junction 15 along the edges of the metal body 10 is contorted and extended so that the path along the junction 15 from the external surface of the package to the internal surface 10a of body 10 is at least twice as long as the distance separating parallel faces 10a and 10b. By including flange 17 on body 10, the potential leakage path formed by the metal-to-plastic junction is thus elongated and contorted. The likelihood of leakage is therefore greatly reduced. By making the edge surface of body 10 which defines the junction irregular, interdigitated contact is formed between the metal body 10 and the plastic body 14 which greatly enhances the structural integrity of the package unit formed. Since the junction 15 is formed by interdigitated sections of metal and plastic, the danger of leakage because of mismatched coefficients of thermal expansion is also greatly reduced. The package unit is thus much less susceptible to damage or leakage caused by mechanical stress. Accordingly, in the structure of FIG. 1 the plastic package has means to directly conduct heat from the device chip 13 to an exposed surface 10b while maintaining the integrity of the package so that the likelihood of water vapor leakage into the package is substantially reduced.

It should be noted that the invention is not limited to use of metals for the heat transfer body 10. Various other materials such as ceramics and the like may be used. Even though ceramics generally exhibit coefficients of thermal conductivity which are considerably less than that of most metals, their coefficients of thermal conductivity are at least an order of magnitude greater than that of most plastic materials used for forming plastic packages. Furthermore, ceramics generally exhibit coefficients of thermal expansion which are more compatible with plastic bodies than that of metals. Therefore, adequate ceramic-to-plastic seals are more readily formed than metal-to-plastic seals. Accordingly, for purposes of this disclosure, such terms as "heat transfer body" and "thermally conductive body" are used to mean any body of material having a coefficient of thermal conductivity greater than $1 \times 10^{-6}$ cal./cm.°C. sec. whether the body is metal, ceramic or otherwise.

Figure 2:
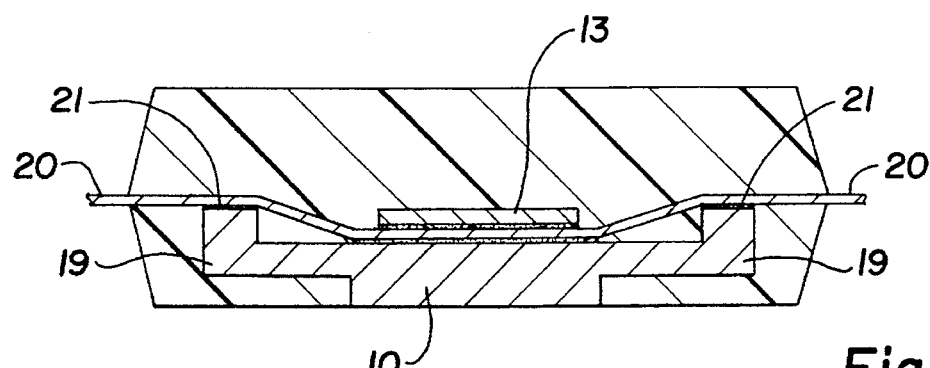
FIG. 2 is a sectional view of a plastic package illustrating an alternate embodiment of the invention.

In the alternate embodiment illustrated in FIG. 2 the heat transfer body 10 has enlarged flanges 19 which extend outwardly from the body 10 and upwardly to the plane of the frame leads 20. In order to further stabilize the body 10, the upper edges of flanges 19 are secured to leads 10 by an electrically non-conductive adhesive 21. It will be appreciated that in the embodiment of FIG. 2 the body 10 is even further stabilized by its attachment to the frame leads 20. The metal-to-plastic junction 15 is extremely elongated, providing further protection against water vapor encroachment or the like and providing further structural stability to the package unit.

Plastic packaging is not conventionally used for extremely high frequency devices because of the adverse effects of dielectric coupling and the like encountered when the wire leads interconnecting the device chip and the frame leads are encapsulated in plastic. Accordingly, high frequency devices are ordinarily packaged in much more expensive metal or ceramic packaging so that the chip and its interconnection means may be enclosed in a gas-filled or evacuated cavity. However, as illustrated in FIG. 3 the principles of the present invention may be employed to provide an air (or other gas) cavity package for high frequency devices, optically controlled devices and the like.

In the arrangement of FIG. 3 the heat transfer body 10 is secured directly to the frame leads 20 with an electrically non-conductive adhesive 21 as discussed above with reference to FIG. 2. In the embodiment of FIG. 3 the chip 13 is attached directly to the body 10 instead of a die pad. However, it will be readily recognized that the die pad structure may be used with similar results. After the device chip 13 is secured within the cavity and the device chip 13 connected to the frame leads 20 by wires 23, a dished cap 25 is positioned over the cavity. The perimeter of cap 25 is complimentary with the perimeter of flange 19 of metal body 10 so that the cap 25 cooperates with metal body 10 to define and form a cavity 22. The cap 25 is secured to the top surface of the frame leads 20 by electrically non-conductive adhesive 21.

In one preferred embodiment cap 25 is a metal dish. Accordingly, cap 25, when bonded to metal body 10, forms a completely enclosed metal package defining a cavity which contains the electronic device chip 13.

Metal and glass package structures similar to that formed by cap 25, body 10 and frame leads 20 are known in the art. However, in producing such prior art structures, great care must be exercised in selecting and applying an electrically non-conductive adhesive 21 which provides the necessary physical rigidity and mechanical strength and reliability while also providing a moisture barrier and an electrically non-conductive medium. Obviously, adhesives satisfying these criteria are somewhat rare; are difficult to work with; and are therefore somewhat unreliable. In accordance with the present invention, however, adhesive 21 need only provide electrically non-conductive characteristics and minimal structural rigidity. Environmental sealing and structural rigidity are accomplished by encapsulating the entire metal structure within a plastic body 14 using otherwise conventional plastic encapsulation techniques. Since the plastic body 14 completely encases the junction between metal body 10 and frame leads 20 as well as the junction between leads 20 and cap 25, structural rigidity, mechanical strength and package sealing are provided by the plastic. Accordingly, the embodiment of FIG. 3 provides an air cavity plastic package having many of the desireable attributes of metal or glass packages. However, the plastic package of FIG. 3 can be formed much less expensively and much more reliably than similar metal packages.

It will be noted that in sealing the cap 25 to the frame leads 20, vapors may be released from the adhesive 21 into the cavity. To permit escape of such vapors during the assembly process, an aperture 26 is provided in metal body 10. Since aperture 26 need only provide a path for escape of vapors from the interior of the cavity 22 during assembly, the diameter of aperture 26 may be relatively small with respect to its length. Since the cavity 22 is totally sealed except for aperture 26, the material used to form plastic body 14 will flow into aperture 26 during the molding process and seal the cavity without otherwise substantially flowing into the cavity 22. Accordingly, the finished package product is a plastic-encased metal container defining a cavity in which the device chip 13 is contained.

The cap 25 as illustrated in FIG. 3 forms a cavity 22 which contains the chip 13 as well as interconnecting wires 23. Since the plastic body 14 is totally isolated from the wires 23, dielectric coupling and the like between the wires 23 is prevented. Furthermore, since the chip 13 is isolated from and does not contact the plastic body 14, concerns about mechanical stress and the like resulting from mismatched coefficients of thermal expansion between the chip and the plastic are avoided. Accordingly, plastics for forming body 14 may be selected with preference for their mechanical characteristics and the like without concern for the effects encountered when in contact with the device chip 13.

It will be noted that when the cap 25 is metal, the device chip is totally surrounded by metal. Accordingly, the metal container provides a complete EMI shield. However, a metal cap is not necessary to provide EMI shielding. For example, cap 25 may be made from a ceramic or thermoset material on which a thin layer of conductive metal such a aluminum is deposited. The aluminum deposit may be either a continuous film deposit or in the form of a screen or grid. Similarly, the cap may be formed by encapsulating a screen or grid of metal material in plastic and forming the encapsulated material into the desired cap shape. Any such metal material employed in the cap 25 will provide the required EMI shielding. Furthermore, forming the cap 25 from thermoset material provides a more convenient means for bonding the cap 25 to the frame leads 20 and further reduces the cost of producing the air cavity package. It should also be noted that where an EMI shield is not required, a cap 25 made only of plastic may be used.

Figure 5:
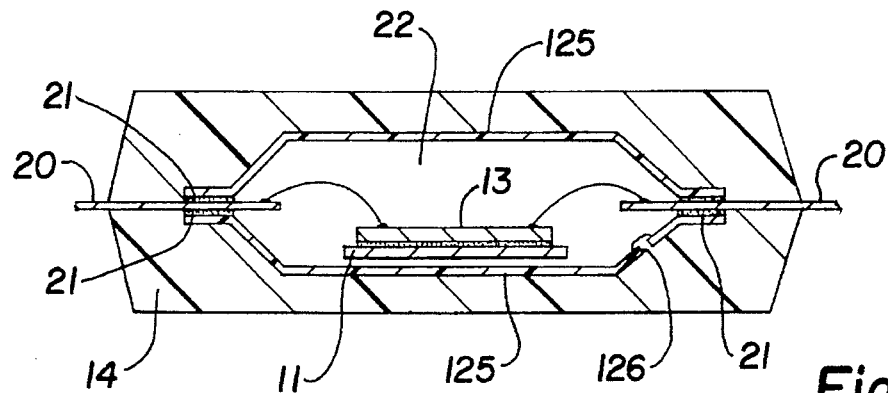
FIG. 5 is a sectional view of an embodiment of the invention employing an air cavity to isolate the device chip from the packaging material.

In the embodiment illustrated in FIG. 5 the chip 13 is attached to the die pad 11 as shown in FIGS. 1 and 2. However, a plastic cap 125 is secured to the frame leads 20 on both sides of the lead frame with a suitably non-conductive adhesive 21. In this configuration a cavity 22 of substantial volume can be formed within the package. Nevertheless, the entire cavity is enclosed in plastic 14 with the only metal-to-plastic interface which extends to the exterior of the package being that between the frame leads 20 and the plastic body 14. Obviously, caps 125 may be metal if desired.

Where the adhesive 21 evolves gas which must be released from the cavity 22 while curing, an aperture 126 is provided in at least one of the caps 125. The aperture 126 may be quite small in diameter to permit the escape of gas and will be plugged by the plastic 14 during the molding process to completely enclose the cavity 22.

It will be readily recognized that cap 125 of FIG. 5 and cap 25 of FIG. 3 may be plastic, metal, ceramic or combinations thereof as described above to provide EMI shielding as required. It will also be recognized that the caps 25 and 125 can be tailored as desired to prevent exposure of the chip 13 to external radiation and to prevent escape of radiation from the cavity. Since caps 25 and 125 can be used to form enclosed cavities within a package, it will be apparent that multiple chips 13 may be mounted within the cavity 22 which are physically and/or electrically isolated from each other but which are adapted for optical interconnection. When desired, the internal surfaces of caps 25 and 125 may be mirrored to aid in optical communication between optically coupled devices contained within the cavity 22.

It should be recognized that while only a single cavity 22 is illustrated in FIGS. 3 and 5, caps 25 and 125 may be suitably configured to provide multiple cavities within a single package and that the caps may include suitable internal optical mirrors, shields or windows to control optical communication between different areas within the cavities formed.

Figure 6:
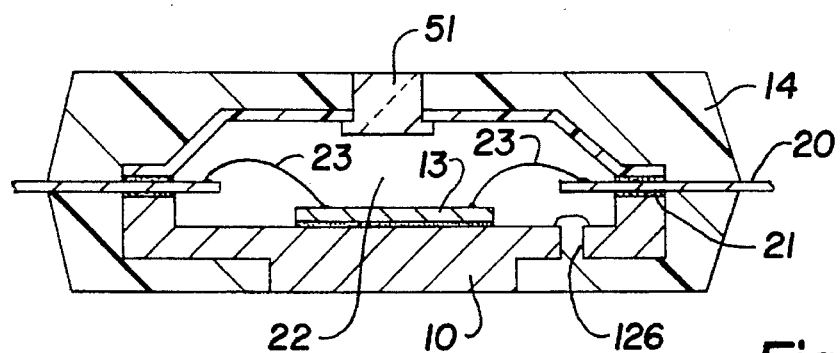
FIG. 6 is a sectional view of an embodiment of the invention which includes an optical window.

In the embodiment illustrated in FIG. 6 a transparent lens or window 51 is secured within an aperture in cap 25 and aligned to expose the chip 13 to optical radiation originating outside the package or to permit optical radiation from chip 13 to escape the cavity 22. The window may be a body of any suitable material which transmits to wavelengths under consideration. Suitable windows can be formed in both plastic and metal caps by conventional techniques to provide a hermetic seal between the material of the cap 25 and the material of the window 51. The size and shape of the window and the cap 25 in which it is supported must be selected so that the external surface of window 51 is adjacent the floor of the mold during the molding process to prevent undesired lovering by the plastic body 14.

Figure 7:
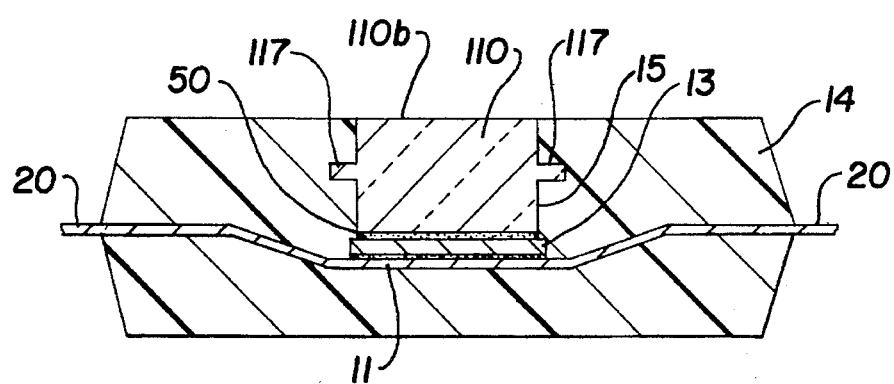
FIG. 7 is a sectional view of another embodiment of the invention employing an optical window.

In the embodiment illustrated in FIG. 7, a transparent window permitting optical communication between the exterior of the package and the chip 13 is provided by a suitably transparent body 110. The body 110 may be glass or a suitably transparent plastic formed in any desired configuration. In the embodiment illustrated, the transparent body 110 is glass and has a flange 117 on its edges to provide an elongated and contorted interface 15 between body 110 and plastic 14 as discussed above. Where hermetic sealing can be readily achieved between the plastic body 14 and body 110, the irregular edges may be omitted.

The body 110 is secured directly to the surface of the chip 13 with an adhesive 50 or the like which is suitably transparent to the optical wavelengths to be employed. The dimensions of body 110 are tailored to ensure that the external surface 110b thereof is adjacent the floor of the mold during plastic encapsulation and securely held in position to avoid formation of an opaque plastic layer thereover. The mold may be configured to support the body 110 and/or to form a suitable configuration in the plastic body to assist in coupling the optical window 110 to a fiber optic connection or the like.

As the functional complexities of device chips increase, it is sometimes necessary or advantageous to provide ground planes, internal busses or the like between contact pads on the chip in the device package itself. Similarly, where a chip having standardized input/output pad orientations is adapted to a package having incompatible input/output leads, a device known as a rerouting board is sometimes included within the device package. A rerouting board or the like is essentially a miniature circuit board which provides electrical communication paths within the package and reorients the input/output pads to be compatible with the frame leads of the device package. Ordinarily, such rerouting boards are either ceramic substrates or polyamide boards or the like. Unfortunately, polyamide boards, when encased in a plastic package, tend to delaminate. Furthermore, since the material of the rerouting board is different from that of the encasement plastic, a difference in coefficients of thermal expansion may cause fracturing or delamination of the rerouting board and components mounted thereon. Temperature related problems associated with such rerouting boards become extremely acute in devices which generate excessive amounts of thermal energy.

Figure 4:
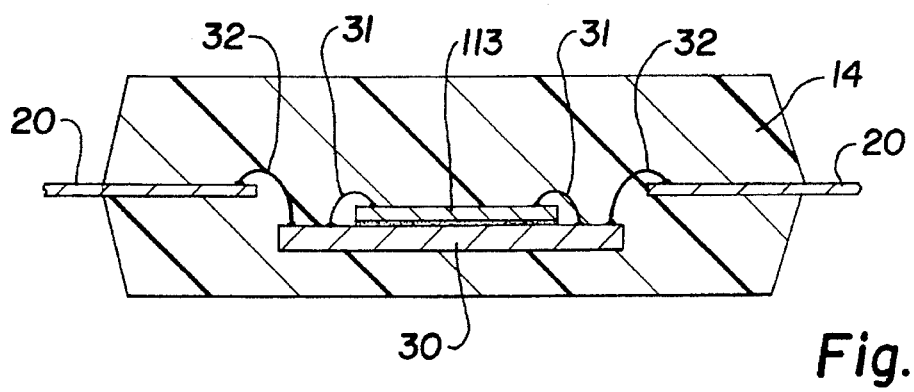
FIG. 4 is a sectional view of an embodiment of the invention including a rerouting chip.

As illustrated in FIG. 4 the thermal problems of the rerouting board are solved by fabricating the rerouting board from material which is the same as or closely approximates the material of the semiconductor chip. For example, as illustrated in FIG. 4 rerouting board 30 is a high resistivity silicon substrate on which circuit paths are suitably formed by diffusion, electroplating, deposition or the like. The device chip 113 is suitably secured to the rerouting board 30 and the interconnection contact pads of the chip 113 connected to the contact pads of the board 30 by wires 31. Similarly, wires 32 connect the contact pads of the rerouting board 30 to the frame leads 20. Since the rerouting board 30 is formed of the same material as the chip 113, mismatches in coefficient of thermal expansion are avoided.

It will be recognized that the chip and rerouting board structure shown in FIG. 4 may be utilized as the chip 13 in any of the structures shown in FIGS. 1–3 and 5–8. Accordingly, since the rerouting board 30 is formed of silicon, the composite rerouting board 30 and chip 113 may be used as desired in any of the package configurations disclosed herein by simply substituting the combination of chip 113 and rerouting board 30 for chip 13 in any of the other configurations.

Figure 8:
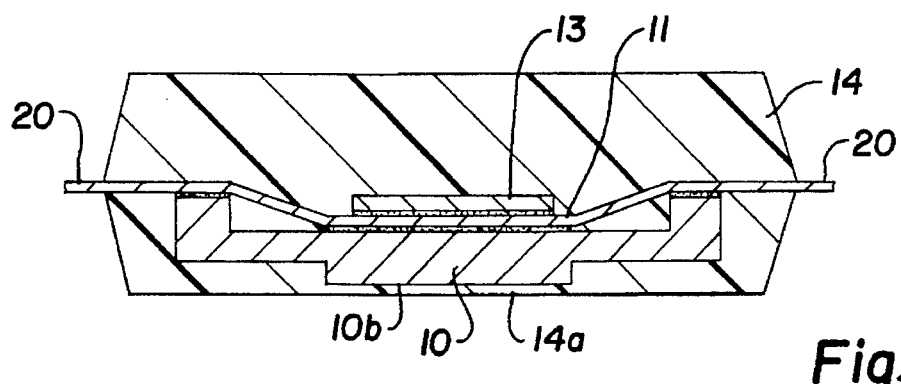
FIG. 8 is a sectional view of an embodiment of the invention in which the heat transfer body is fully enclosed within the plastic body.

FIG. 8 illustrates an embodiment of the invention wherein the heat transfer body 10 does not extend completely to the surface of the package. Instead, the body 10 is secured to the die pad 11 and lead frame 20 as discussed above but does not contact the bottom of the mold cavity. Accordingly, when the plastic is injected into the mold cavity to form plastic body 14, the external surface 10b of the body 10 lies substantially parallel with and adjacent the physical surface of the plastic body but is covered with a thin layer 14a of plastic material. In this manner the heat transfer body 10 is totally encapsulated and the package formed has no leakage path introduced by inclusion of the heat dissipation body 10. Since the body 10 does not extend to the surface of the package, an external heat sink cannot be attached directly to the heat transfer body 10. However, a heat sink can be attached to the external surface of the thin layer 14a of plastic and be adjacent but spaced from the heat transfer body 10 by no more than the thickness of layer 14a. Where layer 14a is sufficiently thin, heat can be sufficiently transferred across the thin layer by radiation. Furthermore, even though the coefficient of thermal conductivity of the encapsulating plastic layer 14a is low, significant heat can be transferred thereacross because it is thin. For purposes of this disclosure, the term "adjacent" is meant to define a location of the surface 10b which approximates the physical surface of the body but permits the formation of a covering layer of plastic during the molding process. The surface 10b can thus be in thermal communication with an external heat sink.

It will be recognized that the thin encapsulation layer 14a may be used in conjunction with the configurations of FIG. 1, 2, 3 and 6 and variations and combinations thereof as well as the embodiment of FIG. 7 so long as the layer 14a is sufficiently transparent to the wavelength of radiation to be transmitted though the window 110. The efficiency of thermal transfer across the thin layer 14a is, of course, determined by such factors as the thickness of the layer 14a, the coefficient of thermal conductivity of layer 14a and the temperature differential across layer 14a. Overall effectiveness can be increased, of course, by increasing the surface area of surface 10b. Since the purpose of layer 14a is solely to provide continuity of the surface of the plastic package, the layer 14a can be made as thin as 0.01 centimeter or less.

From the foregoing description it will become apparent that by using the principles of the invention conventional plastic encapsulation techniques may be modified to form various configurations of plastic packages which efficiently and effectively conduct heat from the device chip to external surfaces of the packages. It will be appreciated, of course, that various combinations and variations of the specific embodiments illustrated and described can be used to achieve particular desired results. It is to be understood, therefore, that although the invention has been described with particular reference to specific embodiments thereof, the forms of the invention shown and described in detail are to be taken as preferred embodiments. Various changes, combinations and modifications thereof may be resorted to without departing from the spirit and scope of the invention as defined by the appended claims.

What is claimed:

1. A package for electronic circuit components comprising:
   (a) a lead frame defining a die location having terminal leads extending therefrom;
   (b) a molded body of plastic material enclosing the lead frame die location and defining a package having opposed sides and opposed edges with terminal leads extending from at least one of said opposed edges;
   (c) an electronic circuit chip positioned in said die location and in electrical communication with said terminal leads; and
   (d) a body of thermally conductive material wholly contained within said molded body of plastic, said body of thermally conductive material having first and second opposed major faces and a flange extending from and at least partially defining the edge surfaces thereof connected to said lead frame with said first major face in thermal contact with said electronic circuit chip and said second major face substantially parallel with and adjacent one of said opposed sides of said package but covered with a layer of said plastic material.

2. A package as defined in claim 1 wherein said layer of plastic is less than about 0.01 centimeter thick.

3. A package as defined in claim 1 wherein said lead frame includes a die paddle and said first major face of said thermally conductive body is secured to said die paddle.

4. A package as defined in claim 1 including a cap secured to said lead frame and cooperating with said thermally conductive body to define a cavity surrounding said die location.

5. A package as defined in claim 4 wherein said cap is secured to said lead frame with an electrically non-conductive adhesive.

6. A package as defined in claim 4 wherein said cap is metal.

7. A package as defined in claim 4 wherein said cap is thermoset plastic.

8. A package as defined in claim 7 wherein at least a portion of said cap is covered with a metal film.

9. A package as defined in claim 8 wherein said metal film is a mirror.

10. A package as defined in claim 8 wherein said metal film is in a grid pattern.

11. A package as defined in claim 4 wherein said cap cooperates with said thermally conductive body to form a plurality of cavities.

12. A package as defined in claim 11 including means providing optical communication between selected ones of said plurality of cavities.

13. A package as defined in claim 4 wherein said cap includes a window providing optical communication between said cavity and the exterior of said package.

14. In a package for electronic circuit components including a lead frame defining a die location with terminal leads extending therefrom and a body of molded plastic enclosing the lead frame die location to define a package having opposed sides and opposed edges with terminal leads extending from at least one of said edges, the improvement comprising:
   (a) a first cap member secured to said lead frame; and
   (b) a second cap member secured to said lead frame and cooperating with said first cap member to define a cavity including said die location enclosed within said molded plastic.

15. The improvement defined in claim 14 wherein said cap members are metal.

16. The improvement defined in claim 14 wherein said cap members are thermoset plastic.

17. The improvement defined in claim 14 wherein said first cap member is plastic.

18. The improvement defined in claim 17 wherein the interior surface of said plastic cap member supports a metallic film.

19. The improvement defined in claim 18 wherein the metallic film is in a grid pattern.

20. The improvement defined in claim 18 wherein said first cap member supports a window providing optical communication between said cavity and the exterior of said package.

21. A device package comprising:
(a) a lead frame assembly;
(b) a thermally conductive body having one major face which defines a portion of the external surface of said package and a flange secured to one side of the frame leads of said lead frame assembly;
(c) a cap having a peripheral edge substantially conforming to and aligned with the peripheral edge of said flange secured to the opposite side of said frame leads and cooperating with said thermally conductive body to define a cavity enclosing the inner ends of said frame leads; and
(d) a molded plastic body encasing the junction between said thermally conductive body and said frame leads, said cap and substantially all of said thermally conductive body except said one major face which defines a portion of the external surface of said body.

22. In a package for electronic components including a lead frame defining a die location with terminal leads extending therefrom and a molded body of plastic enclosing the lead frame die location defining a package having opposed sides and opposed edges with terminal leads extending from at least one of said edges, the improvement comprising:
(a) a first cap member secured to said lead frame;
(b) a second cap member secured to said lead frame and cooperating with said first cap member to define a cavity including said die location; and
(c) an electronic circuit chip comprising;
  (i) a first body of semiconductor material having circuit components formed therein with terminal input/output pads on at least one surface thereof;
  (ii) a second body of semiconductor material of the same composition as said first body of semiconductor material having conductive patterns formed on at least one surface thereof and secured to said first body of semiconductor material;
  (iii) electrical interconnections extending between the terminal input/output pads on said first body of semiconductor material and the conductive patterns on said second body of semiconductor material; and
  (iv) electrical interconnections extending between the conductive patterns on said second body of semiconductor material and said terminal leads.

23. The improvement defined in claim 22 wherein said second cap member comprises a body of thermally conductive material having first and second opposed major faces with said first major face in thermal contact with said electronic circuit chip and said second major face substantially parallel with and adjacent one of said opposed sides of said package.

24. A package for electronic circuit components comprising:
(a) a lead frame defining a die location having terminal leads extending therefrom;
(b) a molded body of plastic material enclosing the lead frame die location and defining a package having opposed sides and opposed edges with terminal leads extending from at least one of said opposed edges;
(c) an electronic circuit chip positioned in said die location and in electrical communication with said terminal leads;
(d) a body of thermally conductive material having first and second opposed major faces with said first major face in thermal contact with said electronic circuit chip and said second major face substantially parallel with and adjacent one of said opposed sides of said package and having a flange extending therefrom connected to the terminal leads defining the die location; and
(e) a cap secured to said lead frame and cooperating with said thermally conductive body to define a cavity surrounding said die location.

25. A package as defined in claim 24 wherein said cap is secured to said lead frame with an electrically non-conductive adhesive.

26. A package as defined in claim 24 wherein said cap is metal.

27. A package as defined in claim 24 wherein said cap is thermoset plastic.

28. A package as defined in claim 27 wherein at least a portion of said cap is covered with a metal film.

29. A package as defined in claim 28 wherein said metal film is a mirror.

30. A package as defined in claim 28 wherein said metal film is in a grid pattern.

31. A package as defined in claim 24 wherein said cap cooperates with said thermally conductive body to form a plurality of cavities.

32. A package as defined in claim 31 including means providing optical communication between selected ones of said plurality of cavities.

33. A package as defined in claim 24 wherein said cap includes a window providing optical communication between said cavity and the exterior of said package.

* * * * *

UNITED STATES PATENT AND TRADEMARK OFFICE
CERTIFICATE OF CORRECTION

PATENT NO. : 5,598,034
DATED : January 28, 1997
INVENTOR(S) : Gene F. Wakefield

It is certified that error appears in the above-indentified patent and that said Letters Patent is hereby corrected as shown below:

Col. 10, line 64, "18" should read ---14---

Signed and Sealed this

Thirtieth Day of December, 1997

Attest:

BRUCE LEHMAN

Attesting Officer

Commissioner of Patents and Trademarks